United States Patent
Kurashima et al.

(10) Patent No.: US 6,608,371 B2
(45) Date of Patent: Aug. 19, 2003

(54) SEMICONDUCTOR DEVICE AND METHOD OF MANUFACTURING THE SAME, CIRCUIT BOARD, AND ELECTRONIC EQUIPMENT

(75) Inventors: Yohei Kurashima, Suwa (JP); Kazushige Umetsu, Suwa (JP); Haruki Ito, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/902,270

(22) Filed: Jul. 11, 2001

(65) Prior Publication Data
US 2002/0017710 A1 Feb. 14, 2002

(30) Foreign Application Priority Data
Aug. 4, 2000 (JP) ........................................ 2000-236811

(51) Int. Cl.[7] .............................................. H01L 23/02
(52) U.S. Cl. ....................... 257/686; 257/685; 257/686; 257/700; 257/706; 257/713; 438/127; 438/109
(58) Field of Search ................................. 257/737, 700, 257/706, 778, 713, 712, 686, 685, 723, 707, 698, 666, 782, 774, 777; 438/127

(56) References Cited

U.S. PATENT DOCUMENTS

| | | | | |
|---|---|---|---|---|
| 5,401,913 A | * | 3/1995 | Gerber et al. | 174/264 |
| 5,594,275 A | * | 1/1997 | Kwon et al. | |
| 5,682,062 A | * | 10/1997 | Gaul | 257/686 |
| 5,861,666 A | * | 1/1999 | Bellaar | 257/686 |
| 6,020,629 A | * | 2/2000 | Farnworth et al. | 257/686 |
| 6,028,358 A | * | 2/2000 | Suzuki | 257/737 |
| 6,093,029 A | * | 7/2000 | Kwon et al. | 439/69 |
| 6,188,127 B1 | * | 2/2001 | Senba et al. | 257/686 |
| 6,236,115 B1 | * | 5/2001 | Gaynes et al. | 257/774 |
| 2002/0000327 A1 | * | 1/2002 | Juso et al. | 174/250 |
| 2002/0048916 A1 | * | 4/2002 | Yanagida | 438/584 |

FOREIGN PATENT DOCUMENTS

JP   A 2000-277689   10/2000

* cited by examiner

Primary Examiner—Nathan J. Flynn
Assistant Examiner—Frazli Erdem
(74) Attorney, Agent, or Firm—Oliff & Berridge, PLC

(57) ABSTRACT

A method of manufacturing a semiconductor device includes: a first step of forming a first through hole that penetrates the location of the electrode in a semiconductor element having an electrode; a second step of providing an insulating material in a region including an inside of the first through hole, in such a manner that a second through hole is provided penetrating through the insulating material; and a third step of providing a conductive member within the second through hole that penetrates through at least the insulating material in the inside of the first through hole.

37 Claims, 10 Drawing Sheets

SEMICONDUCTOR DEVICE AND METHOD OF MANUFACTURING THE SAME, CIRCUIT BOARD, AND ELECTRONIC EQUIPMENT

Japanese patent application no. 2000-236811 filed Aug. 4, 2000 is hereby incorporated by reference in its entirety.

FIELD OF THE INVENTION

The present invention relates to a semiconductor device and method of manufacturing the same, a circuit board, and also electronic equipment.

BACKGROUND OF THE INVENTION

A type of semiconductor device that has recently been developed has a stack structure wherein a plurality of semiconductor chips are stacked. In many cases, the design is such that electrical connections are provided by bonding wires or leads to electrodes of the semiconductor chips, but the provision of such wires or the like places a limitation on reducing dimensions.

SUMMARY

A method of manufacturing a semiconductor device in accordance with the present invention comprises:
  a first step of forming a first through hole that penetrates the location of the electrode in a semiconductor element having an electrode;
  a second step of providing an insulating material in a region including an inside of the first through hole, in such a manner that a second through hole is provided penetrating through the insulating material; and
  a third step of providing a conductive member within the second through hole that penetrates through at least the insulating material in the inside of the first through hole.

Another method of manufacturing a semiconductor device in accordance with the present invention comprises:
  a first step of forming a first through hole that penetrates the location of the electrode in first and second semiconductor elements each having an electrode;
  a second step of providing an insulating material in a region including an inside of the first through hole, in such a manner that a second through hole is provided penetrating through the insulating material; and
  a third step of electrically connecting the electrode of the semiconductor element and a conductive member, and fitting the conductive member into the second through hole in the second semiconductor device, and superposing the first and second semiconductor elements.

A semiconductor device in accordance with the present invention is manufactured by the above described method of manufacturing a semiconductor device.

Another semiconductor device in accordance with the present invention comprises:
  a semiconductor element having an electrode, a through hole being formed at a location of the electrode;
  insulating material provided in a region including an inside of the through hole; and
  a conductive member provided in such a manner as to pass along a central axis of the through hole.

A circuit board in accordance with the present invention has the above described semiconductor device mounted thereon.

Electronic equipment in accordance with the present invention comprises the above described semiconductor device.

DETAILED DESCRIPTION

Figure 1A:
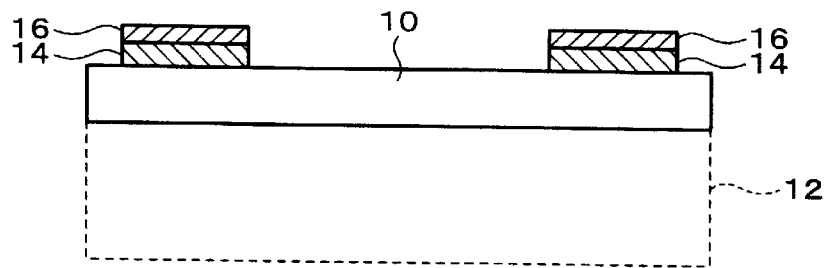
FIGS. 1A to 1C show a method of manufacturing a semiconductor device in accordance with a first embodiment to which the present invention is applied.

Embodiments of the present invention make it possible to provide a semiconductor device and a method of manufacturing the same that facilitate electrical connections with a high level of reliability, together with a circuit board and electronic equipment using the same.

(1) A method of manufacturing a semiconductor device in accordance with an embodiment of the present invention comprises:
  a first step of forming a first through hole that penetrates the location of the electrode in a semiconductor element having an electrode;
  a second step of providing an insulating material in a region including an inside of the first through hole, in such a manner that a second through hole is provided penetrating through the insulating material; and
  a third step of providing a conductive member within the second through hole that penetrates through at least the insulating material in the inside of the first through hole.

This embodiment of the present invention enables electrical connections between one surface of a semiconductor element and the other surface thereof, simply by providing a conductive member in the second through hole of the semiconductor element. Since the conductive member is provided within the second through hole that passes through an insulating material, it is possible to achieve insulation between the semiconductor element and the conductive member in an easy manner.

(2) This method of manufacturing a semiconductor device may further comprise steps of:
  stacking a plurality of the semiconductor devices manufactured by the method defined by claim 1; and electrically connecting upper and lower semiconductor elements by the conductive member.

This ensures that a plurality of semiconductor device are connected electrically by the conductive member that penetrates each semiconductor element. This enables easy manufacture of a semiconductor device having a stack structure of three or more chips, at a minimum size.

(3) A method of manufacturing a semiconductor device in accordance with an embodiment of the present invention comprises:

a first step of forming a first through hole that penetrates the location of the electrode in first and second semiconductor elements each having an electrode;

a second step of providing an insulating material in a region including an inside of the first through hole, in such a manner that a second through hole is provided penetrating through the insulating material; and a third step of electrically connecting the electrode of the semiconductor element and a conductive member, and fitting the conductive member into the second through hole in the second semiconductor device, and superposing the first and second semiconductor elements.

This embodiment of the present invention makes it possible to assemble a plurality of semiconductor elements into a stack structure and also enables electrical connections between the two surfaces of each of the semiconductor elements. It is therefore possible to simplify the manufacturing process. Since each conductive member is provided within the corresponding second through hole that passes through the insulating material, it is possible to achieve insulation between the semiconductor element and the conductive member in an easy manner.

(4) In this method of manufacturing a semiconductor device, in the second step, the insulating material may be formed to cover a surface of the semiconductor element which is opposite to a surface on which the electrode is formed.

This ensures that the insulating material is not provided over the surface of the semiconductor element, making it easy to provide. Particularly when the semiconductor element is thin, this method makes it easy to handle the semiconductor element in subsequent steps. It is further possible to increase the reliability of the semiconductor device in either intermediate products or the final product, by using the insulating material as a stress-relieving layer for the semiconductor element.

(5) In this method of manufacturing a semiconductor device,
the insulating material may be formed of a resin,
a plurality of the semiconductor elements may be pasted together by using the resin as an adhesive, and
the conductive member and the electrode may be electrically connected by heating the resin to complete hardening contraction of the resin.

This ensures that the resin is not just used as an adhesive, the hardening contraction of the resin is utilized to ensure the electrical connection between the upper and lower semiconductor elements, thus simplifying the manufacturing process.

(6) In this method of manufacturing a semiconductor device,
the resin may be heated before a plurality of the semiconductor elements are pasted together, to activate the adhesive force of the resin.

(7) In this method of manufacturing a semiconductor device,
the insulating material may be formed of a resin, and
the resin may be applied in the second step.

This facilitates the handling of the semiconductor element, by the provision of an insulating material created by simply applying on a resin. In other words, the insulating material can be formed without using any special devices. It is therefore possible to form the insulating material inexpensively, rapidly, and easily.

(8) In this method of manufacturing a semiconductor device, in the second step, the first through hole may be filled with the insulating material, and the second through hole having a diameter smaller than a diameter of the first through hole is formed inside the first through hole, in such a manner as to pass through the insulating material.

It is possible to provide reliable insulation between the semiconductor element and the conductive member by forming the insulating material in this manner. In other words, it is possible to achieve electrical connection between both surfaces of a semiconductor element without short-circuiting.

(9) In this method of manufacturing a semiconductor device,
the conductive member may be a conductive paste, and
the second through hole may be filled with the conductive paste in the second step.

Since the conductive paste is provided to fill the second through hole, it is possible to achieve electrical connection between both surfaces of a semiconductor element, without reducing the mechanical strength thereof.

(10) In this method of manufacturing a semiconductor device,
the conductive member may be a bump, and
at least part of the bump may engage with the second through hole in the semiconductor element during the third step.

This makes it possible to provide the conductive member reliably within the second through hole.

(11) In this method of manufacturing a semiconductor device, a plurality of the bumps may be provided in a stack.

(12) In this method of manufacturing a semiconductor device, after the third step, the bump may be melted to fill the second through hole.

Since this fills the second through hole, it is possible to increase the mechanical strength of the semiconductor element thereby.

(13) In this method of manufacturing a semiconductor device, the second through hole may be formed with a taper that decreases in dimension towards the electrode of the semiconductor element.

This makes it possible for a solid conductive member or the like to fit easily into the second through hole.

(14) In this method of manufacturing a semiconductor device, the second through hole may be formed with a taper that decreases in dimension away from the electrode of the semiconductor element.

This prevents removal of the conductive member that is provided in the second through hole.

(15) In this method of manufacturing a semiconductor device, at least one of the first through hole and the second through hole may be formed by a laser beam.

This makes it easy to form a narrow hole in the semiconductor element. It is therefore possible to form a through hole that penetrates the semiconductor element at the locations of the electrode, even if the outer dimensions of the electrode of the semiconductor element are small.

(16) In this method of manufacturing a semiconductor device, the laser beam may be irradiated from a surface opposite to a surface of the semiconductor element on which the electrode is formed.

This makes it difficult for the deposit generated by the use of the laser beam to deposit on the electrode. It is therefore possible to form the through hole easily and thus form a highly reliable semiconductor element.

(17) A semiconductor device in accordance with an embodiment of the present invention is manufactured by the above described method of manufacturing a semiconductor device.
(18) A semiconductor device in accordance with a yet further embodiment of the present invention comprises:

a semiconductor element having an electrode, a through hole being formed at a location of the electrode;

insulating material provided in a region including an inside of the through hole; and a conductive member provided in such a manner as to pass along a central axis of the through hole.

This embodiment of the present invention enables an electrical connection between one surface of the semiconductor element and the other surface thereof, by the conductive member provided in the through hole. Since it is possible to make both surfaces of the semiconductor element conductive, it is possible to provide a compact semiconductor device.
(19) In this semiconductor device, the through hole may be filled with the conductive member.

This ensures there is no deterioration of the mechanical strength of the semiconductor element.
(20) In this semiconductor device, the through hole may be formed with a taper that decreases in dimension towards the electrode of the semiconductor element.
(21) In this semiconductor device, the through hole may be formed with a taper that decreases in dimension away from the electrode of the semiconductor element.

This is designed to prevent removal of the conductive member provided in the through hole.
(22) In this semiconductor device, the insulating material may be provided so as to expose the conductive member and to cover a surface of the semiconductor element which is opposite to a surface on which the electrode is formed.

This makes it possible to relieve stresses applied to the semiconductor element, byway of example. It is therefore possible to provide a highly reliable semiconductor device.
(23) In this semiconductor device, a part of the conductive member may protrude to an outside of the through hole, at a surface of the semiconductor element which is opposite to a surface on which the electrode is formed.

This makes it easy to position another semiconductor device with reference to the protruding portion, when the other semiconductor device is being stacked thereupon.
(24) In this semiconductor device, a stack of a plurality of the semiconductor devices may be provided, and upper and lower semiconductor elements may be connected electrically by the conductive member.
(25) A circuit board in accordance with an embodiment of the present invention has the above described semiconductor device mounted thereon.
(26) Electronic equipment in accordance with an embodiment of the present invention comprises the above described semiconductor device.

Preferred embodiments of the present invention are described below with reference to the accompanying figures. It should be noted, however, that the present invention is not limited to the embodiments described below. Note also that details of these embodiments that are given below can be applied as far as possible to other embodiments.

First Embodiment

A method of manufacturing a semiconductor device in accordance with a first embodiment in which the present invention is used is shown in FIGS. 1A to 2C. FIG. 1A shows a semiconductor chip 10 (semiconductor element) that is used in this embodiment of the invention. In the example shown by this embodiment, the semiconductor chip 10 is one of a plurality of chips cut from a semiconductor wafer. The semiconductor chip 10 is generally of a rectangular parallelepiped shape (including a cube), but the shape is not limited thereto and it could also be a sphere.

The semiconductor chip 10 could be ground to be thinner than thickness of the original semiconductor chip 12 (or semiconductor wafer). More specifically, the semiconductor chip 10 is ground on the surface that is opposite to that on which the integrated circuitry is formed (the active surface). The thickness of the semiconductor chip 10 can be made as thin as possible, except for the portion on which the integrated circuitry is formed. This thickness is not limited, but it may be on the order of 50 $\mu$m. The use of a thin semiconductor chip 10 enables the manufacture of a small, high-density semiconductor device.

The grinding of the semiconductor chip 10 could be done either before dicing or after dicing. In addition, a method could be employed whereby grooves of a depth that is greater than the thickness of the semiconductor chip 10 are formed in a semiconductor wafer 12, then a plurality of the semiconductor chips 10 are separated therefrom by grinding the semiconductor wafer 12.

The semiconductor chip 10 has a plurality of electrodes 14 on a surface on which is formed an integrated circuit. These electrodes 14 are often formed of aluminum, but they could be formed of another metal such as copper. The electrodes 14 have dimensions that depend on the design, but they could be of an angular shape such that one side is approximately 100 $\mu$m, by way of example. The electrodes 14 are formed on an edge portion or a central portion of the semiconductor chip 10. The electrodes 14 could be formed along two or four sides of the semiconductor chip 10.

A passivation film (not shown in the figure) is often formed on this semiconductor chip 10, covering edges portions and avoiding the central portion with the electrodes 14. This passivation film could be formed of a material such as $SiO_2$, SiN, or a polyimide resin, by way of example.

Plating 16 could be formed over each electrode 14. The step of forming the plating 16 could be performed either before or after the semiconductor chip 12 is ground. The plating 16 could be formed by non-electrolytic plating. The formation of this plating 16 over the electrodes 14 enables removal of oxide films from the electrodes 14. The plating 16 also enables ready wetting by solder or the like in a subsequent step. The plating 16 is determined by the material of the electrodes 14. If the electrodes 14 are of aluminum, for example, the plating 16 could be formed of a material that comprises nickel and gold.

The method of manufacturing a semiconductor device in accordance with this embodiment of the present invention uses the above-described semiconductor chip 10 in the steps described below. Alternatively, this manufacturing method could further comprise any of the previously described steps.

Figure 1B:
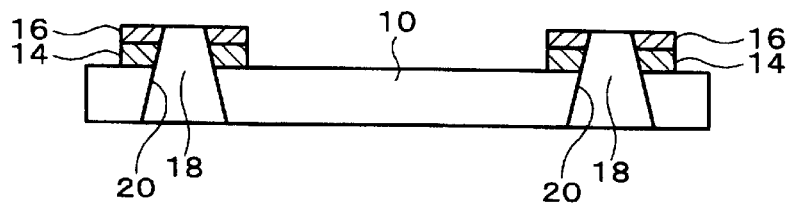

First through holes 18 are formed in the previously described semiconductor chip 10, as shown in FIG. 1B. Each of the first through holes 18 penetrates through the semiconductor chip 10 at the location of one of the electrodes 14. The first through holes 18 could be formed by using means such as a laser (such as a YAG laser or excimer laser). Use of a laser makes it possible to easily form a first through hole 18 that has a diameter which decreases towards the inside of the corresponding electrode 14, even if the electrode 14 has an angular shape with sides of approximately 100 $\mu$m. Note that the first through holes 18 could be either circular or have an angular shape in plan view, or other shapes could be considered.

The laser beam could be applied from only one surface of the semiconductor chip 10 or from both surfaces thereof (either sequentially or simultaneously). In the former case, the laser beam could be applied from the surface of the semiconductor chip 10 opposite to that on which the electrodes 14 are formed. This makes it possible to discourage the deposition of slag formed by the use of the laser beam, onto the electrodes 14 (the plating 16). In addition, a protective film (not shown in the figure) could be formed over the electrodes 14 (the plating 16) beforehand, so that the slag generated by the use of the laser beam with be deposited on that protective film. It would be sufficient to remove that protective film from the electrodes 14 (the plating 16) later, to ensure that the unwanted materials are not deposited on the electrodes 14 (the plating 16). The protective film could be formed of a material such as resist or ink. Note that when the laser beam is applied, a hollow (not shown in the figure) could be formed beforehand as a mark for the application of the laser beam.

The inner surface of each first through hole 18 could be formed to have a tapered shape. For example, the first through hole 18 could be formed to have a taper 20 that decreases in dimension towards the corresponding electrode 14 of the semiconductor chip 10. In such a case, the major diameter of each first through hole 18 could be of a size that is less than twice the thickness of the semiconductor chip 10. This would make it easy to form the tapered first through hole 18 with a laser beam. If the thickness of the semiconductor chip 10 is approximately 50 μm, by way of example, the major diameter of the first through hole 18 could be on the order of 60 to 80 μm and the minor diameter thereof could be on the order of 30 to 40 μm. The application of this taper 20 makes it possible to apply a similar taper 26 (see FIG. 2A) to a second through hole 24 in a subsequent step. Alternatively, each of the first through holes 18 could be formed to have an inner wall surface that is perpendicular to the surface of the semiconductor chip 10.

These steps could be done while a plurality of the semiconductor chips 10 are still attached to the dicing tape used during the grinding. This makes it possible to apply the laser beam at precise locations, based on the dicing line along which the plurality of semiconductor chips 10 are aligned.

Figure 1C:
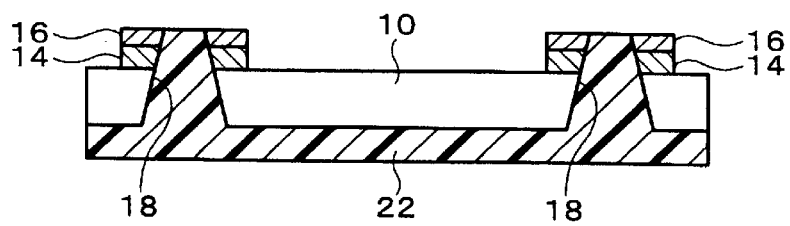

An insulating material 22 is formed in a region comprising the inside of each first through hole 18, as shown in FIG. 1C. As shown in the figure, the insulating material 22 could be formed to fill the first through holes 18. This makes it possible to insulate the semiconductor chip 10 reliably within the first through holes 18. Alternatively, the insulating material 22 could be formed only on the inner wall surfaces of the first through holes 18. Note that the insulating material 22 could be formed of a resin, an oxide film, or a nitride film.

As shown in the figure, the insulating material 22 could also be provided covering the surface of the semiconductor chip 10 opposite to that on which the electrodes 14 are formed. The insulating material 22 could also be provided to extend in the direction of extension of the first through holes 18. In such a case, the insulating material 22 could form a surface on the semiconductor chip 10. Since the insulating material 22 could be provided over the entire surface of the semiconductor chip 10 in such a configuration, it would be easy to provide it over the insides of the first through holes 18. In addition, it prevents breakage of the thin, easily breakable semiconductor chip 10, making the semiconductor chip 10 easier to handle in subsequent step. The insulating material 22 can also absorb ant warping of the semiconductor chip 10 when it expands and is likely to warp due to the heat induced by grinding. In other words, the stresses applied to the semiconductor chip 10 can be alleviated by the insulating material 22.

The insulating material 22 could be applied by painting. In such a case, the insulating material 22 could be a resin. The resin could be painted by using a dispenser, by way of example. It is possible to insulate the semiconductor chip 10 by allowing the solvent to evaporate to dry the resin. This makes it easy to handle the semiconductor chip 10, since the resin is simply painted thereon. This is particularly effective when using a thin, easily breakable semiconductor chip 10, because this would be sufficient and not break the semiconductor chip 10.

Alternatively, the insulating material 22 could be provided by using a screen printing or ink-jet printer method. With an ink-jet printer method in particular, it is possible apply the techniques employed for using ink-jet printers to enable fast, economical, painting that does not waste ink. Since ink-jet heads (not shown in the figure) have already been developed for ink-jet printer use, it is possible to use a piezo-jet type of printer that uses piezoelectric elements or a bubble-jet printer that uses electrothermal converters as energy-generating elements, by way of example, making it possible to set any desired ejection area and ejection pattern.

Note that the insulating material 22 could be formed by using chemical vapor deposition (CVD) or light-sensitive resin, using a mask, but the means thereof is not limited thereto.

Figure 2A:
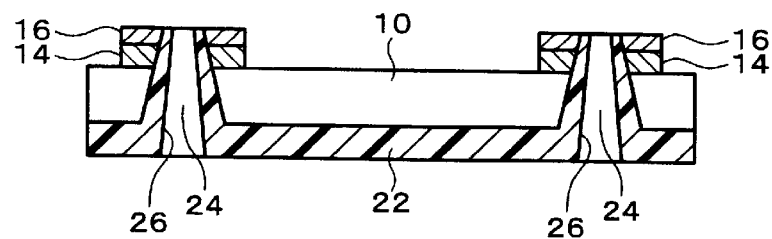
FIGS. 2A to 2C further show the method of manufacturing a semiconductor device in accordance with the first embodiment to which the present invention is applied.

The second through holes 24 are formed as shown in FIG. 2A. The second through holes 24 could be formed after the provision of the insulating material 22 in the first through holes 18 in the previously described step. The second through holes 24 have a diameter that is smaller than that of the first through holes 18 in the inside of the first through holes 18. The second through holes 24 penetrate through the insulating material 22. If the insulating material 22 is provided to extend as far as the surface of the semiconductor chip 10, as shown in the figure, each of the second through holes 24 further penetrates through the portion of the insulating material 22 provided through the corresponding first through hole 18.

The details given with reference to the first through holes 18 can also be applied for the formation of the second through holes 24. In other words, the second through holes 24 could be formed by the application of a laser beam. Since this makes it possible to form narrow through holes, it makes it easy to form the second through holes 24 having a diameter that is even smaller than that of the first through holes 18.

The inner surface of each of the second through holes 24 could be formed to have a tapered shape. The second through holes 24 could be formed with a taper that decreases in dimension towards the electrode of the semiconductor element. This would make it possible to fit a solid conductive member easily into the hole, from the surface of the semiconductor chip 10 opposite to that on which the electrodes 14 are formed. The semiconductor chip 10 is covered by the insulating material 22 and the second through holes 24 could be made to penetrate though this insulating material 22, which determines the diameter thereof. Note that the plan shape of the second through holes 24 is not restricted in any way.

Alternatively, each of the second through holes 24 could be formed to have an inner wall surface that is perpendicular to the surface of the semiconductor chip 10.

Figure 2B:
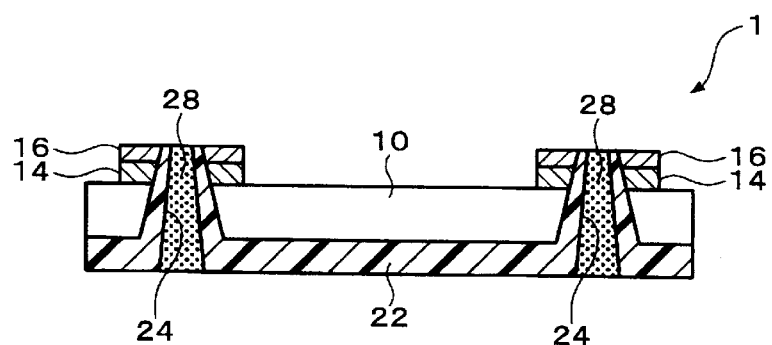

A conductive member 28 is provided in the inside of each of the second through holes 24, as shown in FIG. 2B. The conductive member 28 is provided at least within the second through holes 24. Each conductive member 28 could be provided so as to pass along the central axis of the corresponding second through hole 24. Alternatively, each conductive member 28 could be provided offset from the central axis, provided the intension is to insulate the semiconductor chip 10 via the insulating material 22. As shown in the figure, each conductive member 28 could be formed to fill the corresponding second through hole 24. The conductive member 28 could be formed of a conductive paste. A wax material such as an electrically conductive resin or solder could be used as the conductive paste. Since the conductive member 28 is provided so as to fill the corresponding second through hole 24, it is possible to design electrical connections for both surfaces of the semiconductor chip 10 without deteriorating the mechanical strength of the semiconductor chip 10.

Alternatively, if the insulating material 22 is provided only on the inner wall surface of each of the first through holes 18 in the previously described steps, the conductive member 28 is provided in such a manner as to pass along the central axis of the hole (the second through) surrounded by the insulating material 22 in the inside of the first through hole 18. In this case too, the conductive paste could be made to fill the hole.

A semiconductor device 1 that is shown in FIG. 2B is obtained by the above described steps. The semiconductor device 1 comprises the semiconductor chip 10, which has the electrodes 14 with through holes (such the second through holes 24) formed at the locations of the electrodes 14, the insulating material 22, and the conductive member 28.

In the example shown in this figure, the insulating material 22 is provided on a region comprising the inner surface of each of the second through holes 24. In other words, the second through holes 24 are formed to be surrounded by the insulating material 22. The insulating material 22 could also be provided to cover the surface of the semiconductor chip 10 opposite to that on which the electrodes 14 are formed. This makes it possible to relieve any stresses applied to the semiconductor chip 10.

Each conductive member 28 is provided so as to pass along the central axis of the corresponding second through hole 24. The conductive member 28 could be provided to fill the second through hole 24. This ensures that the second through hole 24 is packed, ensuring that there is no deterioration of the mechanical strength of the semiconductor chip 10. The conductive member 28 is exposed from the surface of the insulating material 22 or the semiconductor chip 10 on the side of the semiconductor chip 10 opposite to that on which the electrodes 14 are formed. The second through hole 24 could be provided with the taper 26 as described above, and the side surface of the conductive member 28 could be formed to have a corresponding tapered shape. Note that other details of the configuration and manufacturing method of the semiconductor device are as recorded herein.

A semiconductor device in accordance with this embodiment of the present invention provides electrical connections between one surface of the semiconductor chip 10 and the other surface, by the conductive members 28 provided in the through holes (such as the second through holes 24). Since both surfaces within the semiconductor chip 10 can be made conductive, it is possible to provide a compact semiconductor device.

Figure 2C:
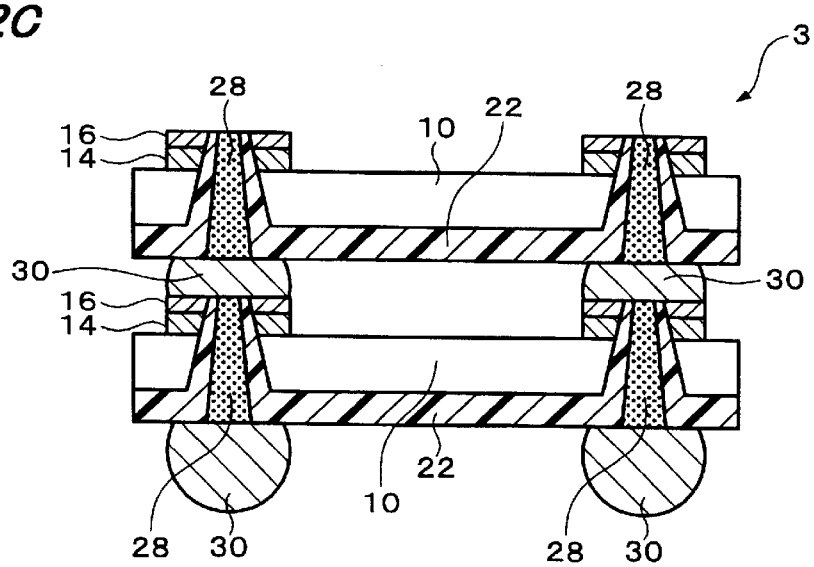

A plurality of the semiconductor chips 10 (the semiconductor devices 1) formed by the previously described method are stacked together, as shown in FIG. 2C. More specifically, upper and lower semiconductor chips 10 are connected electrically by the conductive members 28. In other words, a semiconductor device with a stack structure is created thereby. As shown in the figure, the upper and lower semiconductor chips 10 could be stacked in such a manner that the surface of one of the semiconductor chips 10 opposite to that on which the electrodes 14 thereof are formed faces the surface of the other semiconductor chip 10 on which the electrodes 14 are formed. Alternatively, the two surfaces on which the electrodes 14 are formed would be placed facing each other, the opposite surfaces thereof could be placed facing each other, or three or more semiconductor chips 10 could be stacked together in any combination of the above configurations.

The upper and lower semiconductor chips 10 could be connected electrically by solder 30. The solder 30 could be provided previously on either one or both of the semiconductor chips 10. This solder 30 could be mounted thereon in ball form or it could be provided between the upper and lower semiconductor chips 10 by the surface tension generated during melting.

The solder 30 joins together the conductive members 28 of one of the semiconductor chips 10 on top of the electrodes 14 (the plating 16) of the other semiconductor chip 10. In this case, the solder 30 connects together the upper and lower semiconductor chips 10 and also electrically connects the electrodes 14 to the conductive members 28 insulated by the insulating material 22 on the semiconductor chip 10 on the side provided on top of the electrodes 14 (the plating 16). In other words, the upper and lower semiconductor chips 10 are stacked together and, at the same time, it is possible to plan electrical contacts between the electrodes 14 and the conductive members 28 on the semiconductor chip 10 provided on top of the electrodes 14 (the plating 16). This makes it possible to simplify the manufacturing process. Alternatively, the electrodes 14 and the conductive members 28 of one of the semiconductor chips 10 could be connected electrically before the chips are stacked together. In such a case, the electrical connection could be obtained by providing a conductive material (such as conductive paste, not shown in the figure) in such a manner that it covers the electrodes 14 (the plating 16) and the conductive members 28. In the example shown in the figure, the electrodes 14 and the conductive members 28 of the semiconductor chip 10 of the uppermost layer are connected electrically by the previously described conductive material (not shown in the figure).

Note that the form of connection between the upper and lower semiconductor chips 10 is not limited to the solder 30 and could equally well be in the form of a conductive resin paste (including an anisotropic conductive material), a metal junction such as an Au—Au or Au—Sn junction, or a junction formed by the force of contraction of the insulating resin. If a metal junction is planned, by way of example, bumps could be provided connected to the conductive member 28 on the surface of the semiconductor chip 10 opposite to that on which the electrodes 14 are formed, then the electrodes 14 (the plating 16) of the semiconductor chip 10 can be joined thereto.

The solder could be provided on the lower semiconductor chip 10, on the surface thereof which is opposite to that facing the other semiconductor chip 10. The solder 30 could be provided in a ball shape, as described previously. The solder 30 could be formed on the surface of the semiconductor chip 10 opposite to that on which the electrodes 14 are formed, or on the surface facing the electrodes 14. Providing the solder 30 on the lower semiconductor chip 10 makes it easy to mount the assembly on a circuit board (motherboard) or a substrate (interposer) mounted on a circuit board.

Alternatively, the electrical connection could be achieved by painting a wiring pattern in solder cream on the circuit board side and employing surface tension due to melting, without forming balls of the solder 30 on the lower semiconductor chip 10, during the mounting onto the circuit board. Note that the lowermost semiconductor chip 10 could be placed with the surface on which the electrodes 14 are formed facing the circuit or with the opposite surface facing it. Note also that the form of the electrical connection between each semiconductor device and the circuit board could be as described previously.

This embodiment of the present invention makes it possible to provide electrical connection between one surface of each semiconductor chip 10 and the other surface thereof, simply by providing the conductive members 28 in the second through holes 24 of the semiconductor chip 10. Reliable conductivity between each conductive member 28 and the corresponding electrode can be designed by providing the conductive member 28 so as to pass along the central axis of the second through hole 24, surrounded by the insulating material 22. It is also possible to manufacture a stack of three or more semiconductor devices easily and to a minimum size, by providing the conductive members 28 penetrating through the semiconductor chip 10 and stacking together a plurality of semiconductor devices.

Figure 3:
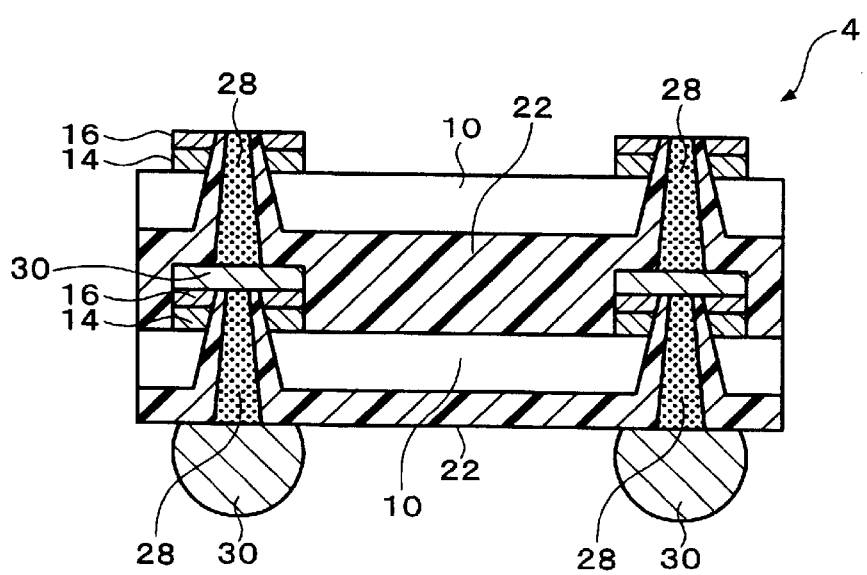
FIG. 3 is illustrative of a method of manufacturing a semiconductor device in accordance with a variation of the first embodiment to which the present invention is applied.

The description now turns to a method of manufacturing a semiconductor device in accordance with a variation of this embodiment of the present invention, with reference to FIG. 3. In this variation, the insulating material 22 is used as an adhesive to stick the upper and lower semiconductor chips 10 together. The insulating material 22 could be a resin. The resin is preferably a thermosetting resin. The resin is provided on the surface of the semiconductor chip 10 opposite to that on which the electrodes 14 are provided.

First of all, the resin is heated to activate the adhesive force thereof, before the plurality of semiconductor chips 10 are stacked together. In other words, the resin is heated sufficiently to bring it to a state in which hardening is not complete (a semi-hardened state). This makes it possible to stick the upper and lower semiconductor chips 10 together, by employing the resin provided on the surfaces of the semiconductor chips 10 as an adhesive.

The plurality of semiconductor chips 10 are then stacked together and the upper and lower semiconductor chips 10 are stuck together by the resin provided on one of the semiconductor chips 10. In other words, the resin is provided between the upper and lower semiconductor chips 10 so as to adhere to the surface of each semiconductor chip 10. Since this embeds the resin between the semiconductor chips 10, it becomes possible to relieve any stresses (such as thermal stresses) applied to the semiconductor devices.

After the upper and lower semiconductor chips 10 have been stuck together, the resin is heated to harden it. More specifically, the resin, which was in a semi-hardened state when the upper and lower semiconductor chips 10 were stuck together, is heated sufficiently to bring it to a state in which the hardening is complete. In that case, the resin could be subject to hardening contraction. In other words, the upper and lower semiconductor chips 10 are tightly bound together by hardening contraction of the resin attached to the surfaces of the semiconductor chips 10. This enables a mechanical connection between the conductive members 28 (the solder 30) of one of the semiconductor chips 10 and the electrodes 14 (the plating 16) of the other semiconductor chip 10, but the force of contraction of the resin. In other words, it is not necessary to press the semiconductor chip 10 towards the other semiconductor chip 10 again. This is intended to simplify the manufacturing process.

Note that the resin used as the adhesive could be provided in a separate step from the previously described insulating material 22. In other words, resin could be provided on the surface of the semiconductor chip 10 opposite to that on which the electrodes 14 are provided, separately from the insulating material 22 provided in the insides of the first through holes 18.

In this variation of the present invention, the resin used as an adhesive is exemplified as being embedded between the upper and lower semiconductor chips 10, but it is equally possible to insert the resin between the upper and lower semiconductor chips 10 after they are stacked. In this case too, the resin is made to fill the area between the upper and lower semiconductor chips 10, making it possible to relieve any stresses (such as thermal stresses) applied to the semiconductor device.

A semiconductor device 4 in accordance with this variation of the present invention comprises a plurality of the semiconductor chips 10 and resin (the insulating material 22) embedded between the various semiconductor chips 10, with the form thereof being as described previously.

Second Embodiment

Figure 4A:
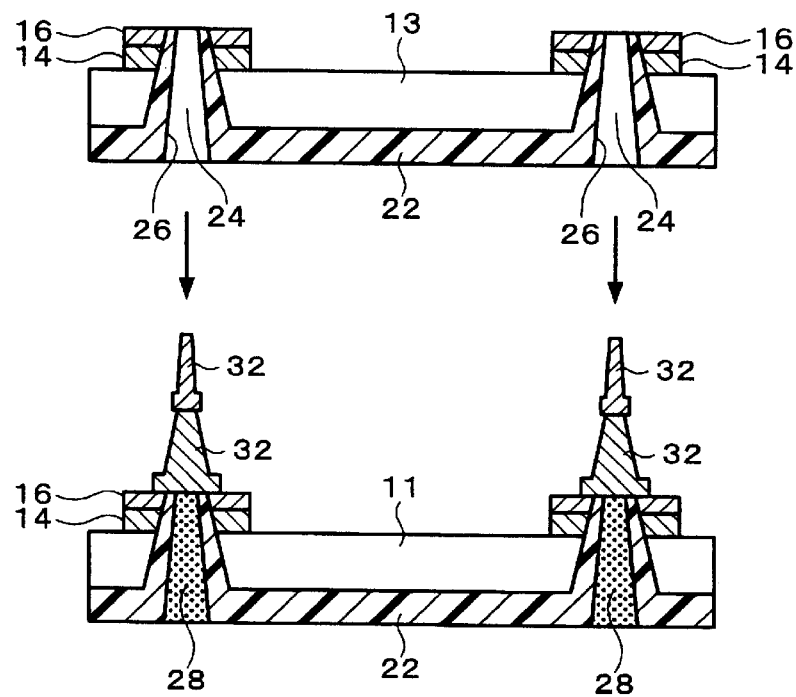
FIGS. 4A and 4B show a method of manufacturing a semiconductor device in accordance with a second embodiment to which the present invention is applied.
Figure 4B:
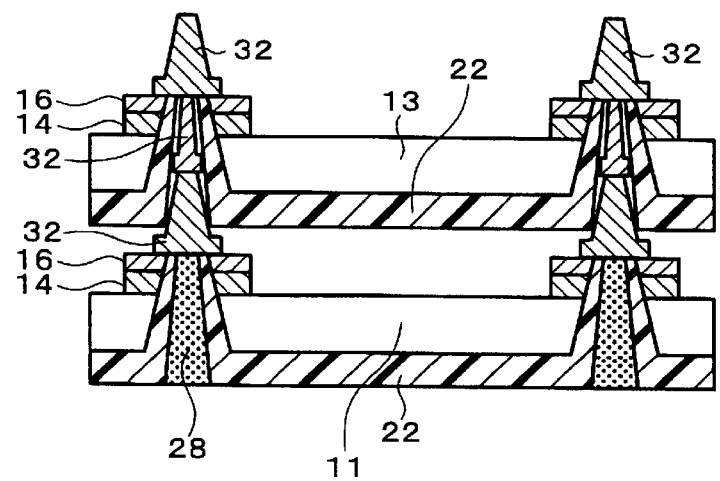

A method of manufacturing a semiconductor device in accordance with a second embodiment to which the present invention is applied is shown in FIGS. 4A and 4B. The method of manufacturing the conductive member 28 of this embodiment differs from that of the previous embodiment.

In this embodiment of the invention, first and second semiconductor chips 11 and 13 are prepared, as shown in FIG. 4A. The second through holes 24 are formed in each of the first and second semiconductor chips 11 and 13 so as to penetrate through the locations of the electrodes 14 of the semiconductor chips, by the steps described previously. With this embodiment, the conductive members are inserted into the second through holes 24 of the second semiconductor chip 13 in a solid state. Each conductive member could be a bump 32. The bump 32 could be formed of a material such as solder or gold.

The electrodes 14 (the plating 16) of the first semiconductor chip 11 are provided connected to the corresponding bumps 32. More specifically, the bumps 32 have been formed previously on the electrodes 14 (the plating 16) of the first semiconductor chip 11, when the first and second semiconductor chips 11 and 13 are disposed in a stack. In the example shown in these figures, the first semiconductor chip 11 is the semiconductor chip 10 formed in accordance with the previous embodiment, with a conductive paste filling the second through holes 24. Each bump 32 is formed on the corresponding electrode 14 of the first semiconductor chip 11. It is also possible to form each bump 32 as a stack of a plurality of bumps, as shown in the figures. In such a case, different types of metal bump can be stacked. For example, the stack could be such that a gold bump is formed on the electrode 14 side, with a solder bump thereupon. As shown in the figures, the bumps 32 could be formed to a height that is greater than the depth of the second through holes 24. The diameter of each bump 32 is formed of a size that ensures that at least the leading-end portion (either the leading-end portion alone or the entire bump) can be inserted into the corresponding second through hole 24.

The bumps 32 could be formed by a method such as plating, vacuum deposition, or by forming ball bumps. Since it is particularly easy to form a stack of a plurality of bumps by a ball bump method whereby bonding wires are melted to form ball shapes, it is easy to form a stack of bumps 32 having a height that is at least a defined height (such as a height that is at least as much as the depth of the second through holes 24).

The bumps 32 could be used to provide electrical connections between the electrodes 14 and the conductive member 28 (conductive paste) in the first semiconductor chip 11. Since this makes it possible to arrange the bumps 32 for provision in the second semiconductor chip 13 at the same time as provide electrical connections between the electrodes 14 of the first semiconductor chip 11 and the conductive member 28, it is possible to simplify the manufacturing process. After the bumps 32 have been formed, the bumps 32 provided on the first semiconductor chip 11 can be fitted into the second through holes 24 of the second semiconductor chip 13. The bumps 32 could penetrate through the second through holes 24, or leading-end portions thereof could be located within the second through holes 24 without penetrating all the way. The base-end portions of the bumps 32 could also be located on the outer side of the second through holes 24 so as to protrude from the surface of the insulating material 22 on the second semiconductor chip 13. Providing each of the second through holes 24 with the previously described taper 26 enables easy insertion of each bump 32 into the corresponding second through hole 24.

After the bumps 32 have been fitted into the second through holes 24, the bumps 32 could be melted. In such a case, it is preferable to have the bumps 32 formed of solder. Melting the bumps 32 makes it possible to cause the conductive member to fill the second through holes 24. In other words, it is possible to increase the mechanical strength of the second semiconductor chip 13 by filling the gaps in the second through holes 24 of the second semiconductor chip 13.

Alternatively, if the bumps 32 are formed of a material such as gold, the bumps 32 could be formed within the second through holes 24 without deformation during insertion. In either case, conductive members can be formed reliably on the central axis of each of the second through holes 24.

Further bumps 32 could be formed on the second semiconductor chip 13 that is the uppermost layer after the first and second semiconductor chips 11 and 13 have been stacked, to enable the stacking of yet another semiconductor chip thereon, as shown in FIG. 4B. This enables electrical connection between the electrodes 14 of the second semiconductor chip 13 and the conductive members (the bumps 32) formed in the second through holes 24 thereof.

The above described steps make it possible to connect together both surfaces of each of the first and second semiconductor chips 11 and 13 by the bumps 32, and also stack together the first and second semiconductor chips 11 and 13. It is therefore possible to expect a simplification of the manufacturing process.

A first variation of this embodiment of the present invention could be formed in such a manner that bumps 32 of a form similar to those described above are formed previously on a separate member (such as a substrate), the semiconductor chip 10 is placed on top of the separate member, and then the bumps 32 are removed from the separate member after the bumps 32 have been fitted into the second through holes 24 of the semiconductor chip 10. In other words, the bumps 32 could be fitted into the second through holes 24 of the semiconductor chip 10 by a transfer method. In such a case, if part of each bump 32 protrudes from the corresponding second through hole 24, such as on the outside on the side opposite to that on which the electrodes 14 are formed, it is easy to locate the semiconductor chip 10 by using the protruding portion as reference. Note that the configuration and effects of the semiconductor device in accordance with this variation are as described previously.

Figure 5:
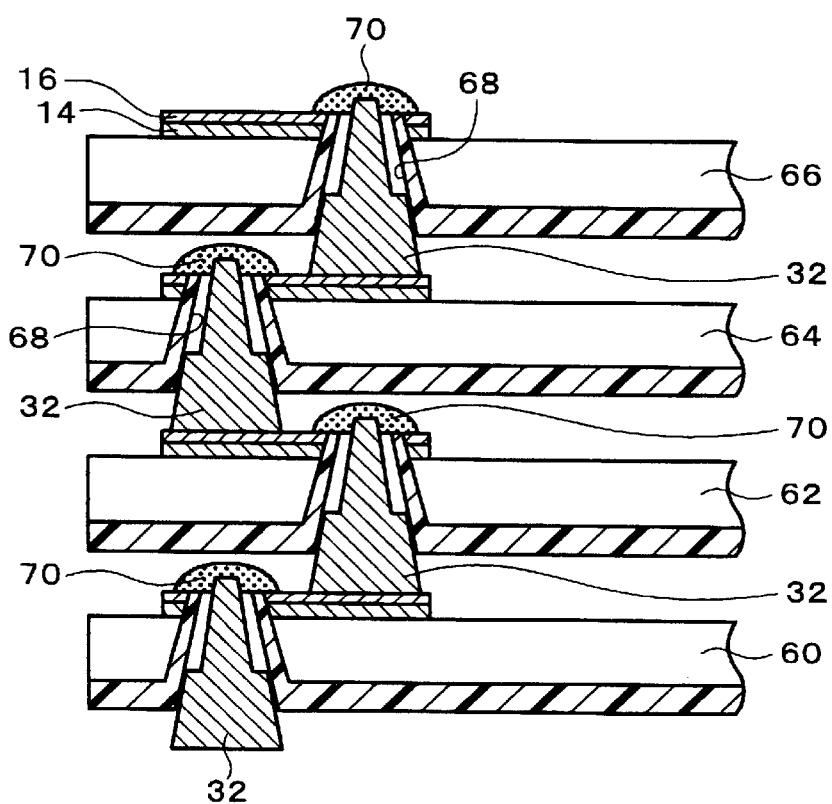
FIG. 5 shows part of a semiconductor device in accordance with a variation of the second embodiment to which the present invention is applied.

A part of a semiconductor device in accordance with a second variation of this embodiment is shown in FIG. 5. With this variation, a plurality of semiconductor chips 60, 62, 64, and 66 are stacked and electrical connections between adjacent semiconductor chips are created by having conductive members (such as the bumps 32) of each semiconductor chip avoid second through holes 68 of the electrodes 14 of the semiconductor chip therebelow. In other words, the arrangement is such that a portion of the electrode 14 that connects to the conductive member is not laid over a portion opened up by the second through hole 68, when each electrode 14 is seen in plan view.

This makes it possible to arrange the bumps 32, which have enabled electrical connections with the electrodes 14, on the surface of the electrodes 14 (the plating 16) before the plurality of semiconductor chips 60 to 66 are stacked together. In other words, electrical connections can be obtained with a substantially flat surface of the electrodes 14 and in a more stable state, by ensuring that the bumps 32 are not provided on top of the second through holes 68 of the lower layer.

It is also unnecessary to provide electrical connections for the bumps 32 with both the electrodes 14 on the semiconductor chip therebelow and the other bumps provided in the second through holes 68 of the semiconductor chip therebelow. In other words, the step of providing electrical connections between the bumps 32 and the electrodes 14 of the semiconductor chip therebelow can be done separately from the step of providing electrical connections with the bumps 32 within the second through holes 68 of the semiconductor chip therebelow. This makes it possible to reduce faults in the electrical connection, enabling an increase of the yield during manufacture.

Note that the electrodes 14 are connected electrically to the conductive members (such as the bumps 32), which are provided penetrating through the semiconductor chip on which these electrodes 14 are formed, by a conductive material 70 such as a conductive paste. More specifically, it is possible to provide the electrical connections therebetween by providing the conductive material 70 in such a manner as to cover the electrodes 14 (the plating 16) and the conductive members (such as the bumps 32).

Other forms of this variation could be envisioned, wherein any two of the plurality of semiconductor chips 60 to 66 are handled as the first and second semiconductor chips, as described above. The method of manufacturing a semiconductor device in accordance with such a variation is as described previously.

Third Embodiment

Figure 6A:
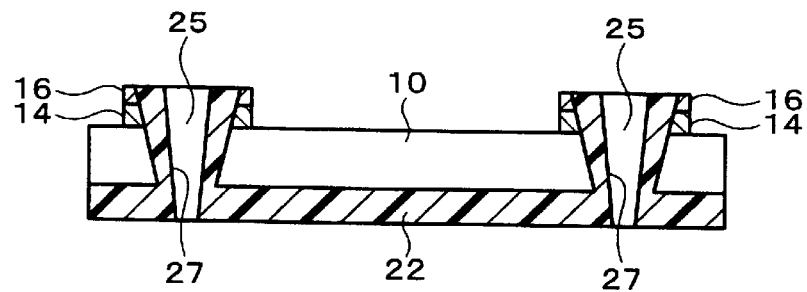
FIGS. 6A and 6B show a method of manufacturing a semiconductor device in accordance with a third embodiment to which the present invention is applied.
Figure 6B:
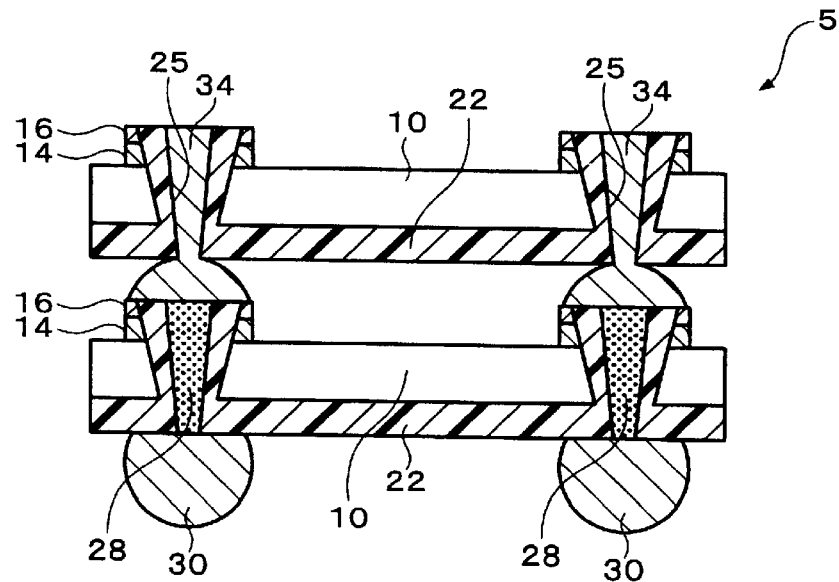

A method of manufacturing a semiconductor device in accordance with a third embodiment to which the present invention is applied is shown in FIGS. 6A and 6B. With this embodiment, the shape of a second through hole 25 differs from those described previously.

As shown in FIG. 6A, the second through hole 25 of this embodiment is formed to have a taper 27. More specifically, the second through hole 25 is formed to have the taper 27 which decreases with distance away from the corresponding electrode 14 of the semiconductor chip 10. The second through hole 25 could be formed by a laser beam, by way of example, by applying the laser beam from the side of the semiconductor chip 10 on which the electrodes 14 are formed, or by applying it from the opposite side. Note that other forms and the manufacturing method of the second through hole 25 are as described previously.

A semiconductor device 5 shown in FIG. 6B has a stack structure of a plurality of the semiconductor chips 10 in which the second through holes 25 are formed. Each second through hole 25 is provided with a conductive member 34 passing along a central axis thereof. In the example shown in this figure, the conductive member 34 is embedded in the second through hole 25. The conductive member 34 could be a solid bump that is fitted into the second through hole 25, which is formed by melting that bump, filling the second through hole 25 therewith, then allowing it to re-solidify. In such a case, the bump could be a solder bump. Part of the solidified conductive member 34 could be made to protrude from an aperture position on the smaller-diameter side of the second through hole 25. This makes it possible to employ the taper 27 provided on the inner surface of the second through hole 25, to prevent removal of the conductive member 34. More specifically, if the portion of the conductive member 34 within the second through hole 25 and the portion thereof that protrudes to the outside from the aperture at the minor-diameter side of the second through hole 25 are formed integrally, it is possible to make it difficult to remove the conductive member 34 from the second through hole 25. Note that the rest of the configuration and effects of the semiconductor device in accordance with this variation are as described previously.

Figure 7:
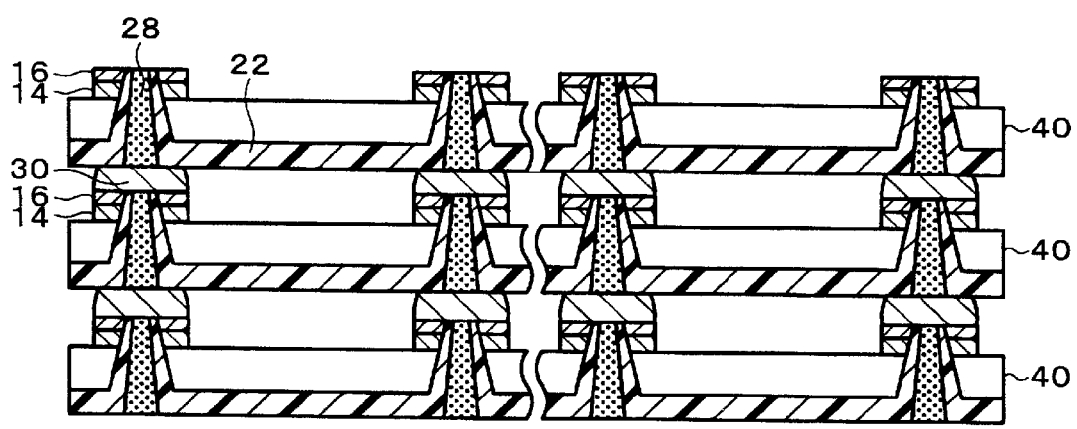
FIG. 7 illustrates a method of manufacturing a semiconductor device in accordance with an embodiment to which the present invention is applied.

The previously described methods of manufacturing a semiconductor device were applied to a semiconductor chip 10, but they could equally well be applied to a semiconductor wafer 40 (semiconductor element), as shown in FIG. 7. After a plurality of these semiconductor wafers 40 have been created by any of the previously described manufacturing methods then placed in a stack, the individual semiconductor chips 10 can be diced therefrom. More specifically, the stack of the plurality of semiconductor wafers 40 could be sliced vertically to divide it into semiconductor chips 10 of a stack structure. Alternatively, the previously described steps could be performed on the semiconductor wafer 40 before a step in which a vertical stack is formed, then the individual the semiconductor chips 10 that have been diced are stacked to form a semiconductor device of a stack structure. This makes it possible to manufacture semiconductor device efficiently, by performing the previously described step on the semiconductor wafer 40. Note that the present invention can also be applied to semiconductor wafers that have been subjected to re-wiring processing called wafer CSP, or to semiconductor wafers that have been provided with a stress-relieving configuration.

Figure 8:
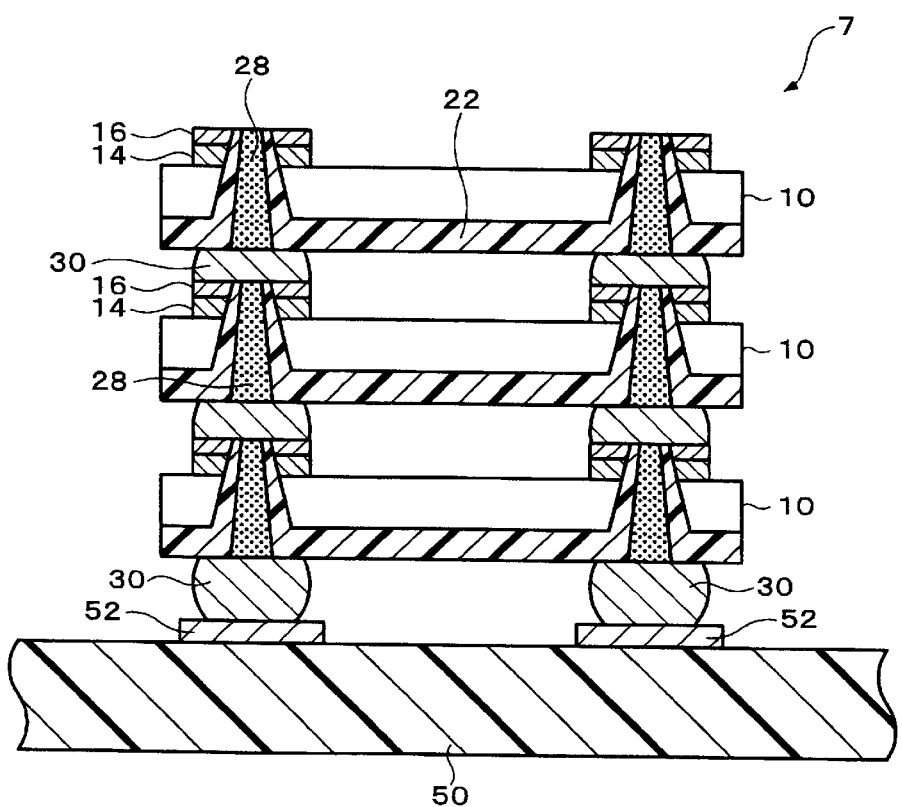
FIG. 8 shows a circuit board on which is mounted semiconductor devices in accordance with an embodiment to which the present invention is applied.

A circuit board 50 on which is mounted a semiconductor device 7 in accordance with a further embodiment of the present invention is shown in FIG. 8. This circuit board 50 is generally formed by using an organic substrate such as a glass epoxy substrate. A wiring pattern 52 that creates desired circuitry is formed on the circuit board 50 with a material such as copper, then this wiring pattern 52 and the solder 30 of the semiconductor device 7 are made electrically conductive by mechanical connections therebetween.

Alternatively, the method of manufacturing a semiconductor device in accordance with the second embodiment could be employed to form the bumps 32 as ball bumps or the like on the wiring pattern 52 of the circuit board 50 beforehand, then each bump 32 could be made to fit into the second through holes 24 of another semiconductor chip 10 thereabove (or a plurality of semiconductor chips 10).

As a further alternative, the semiconductor device 7 is mounted on a substrate (interposer, not shown in the figure) for mounting on the circuit board 50, then electrical connection with the circuit board 50 is achieved by external pins formed on the substrate.

Figure 9:
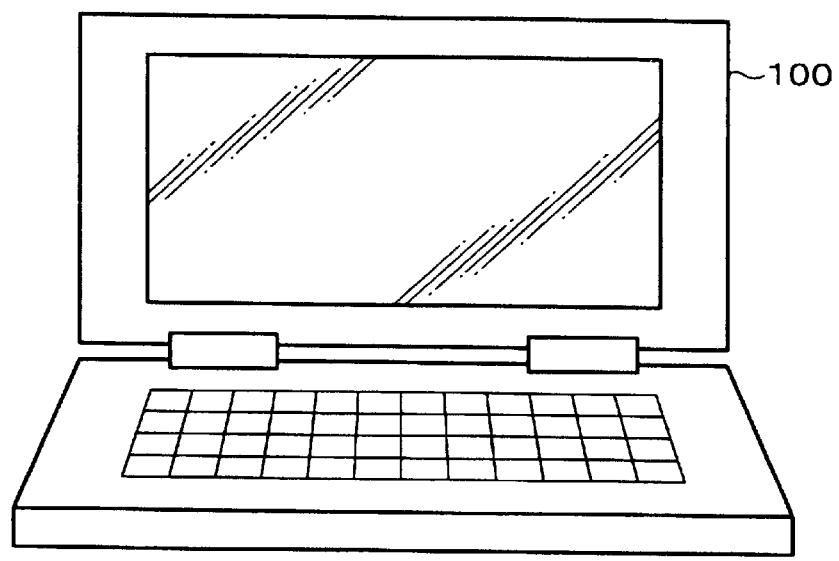
FIG. 9 shows an example of electronic equipment that has a semiconductor device in accordance with an embodiment to which the present invention is applied.
Figure 10:
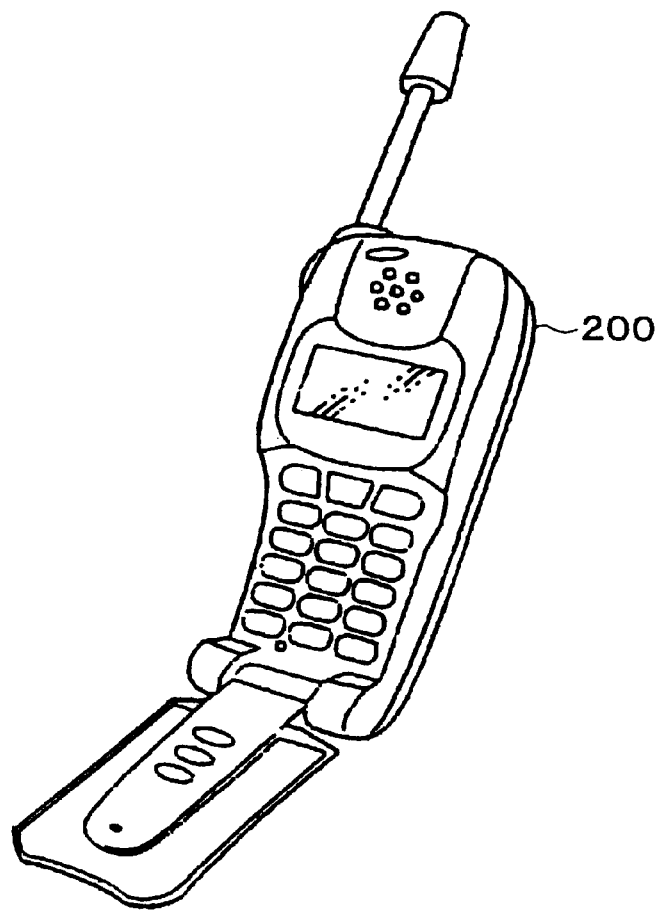
FIG. 10 shows another example of electronic equipment that has a semiconductor device in accordance with an embodiment to which the present invention is applied.

Examples of electronic equipment that use semiconductor devices in accordance with embodiments of the present invention include a notebook computer 100 shown in FIG. 9 and a portable phone 200 shown in FIG. 10.

Note that the term "semiconductor chip" could be replaced with "electronic element" in the above described embodiment of the present invention, to enable the manufacture of electronic components. Examples of electronic components fabricated by using such electronic elements include optical elements, resistors, capacitors, coils, oscillators, filters, temperature sensors, thermistors, varistors, variable resistors, or fuses, by way of example.

What is claimed is:

1. A method of manufacturing a semiconductor device, the method comprising:

a first step of forming a first through hole that penetrates the location of the electrode in a semiconductor element having an electrode;

a second step of providing an insulating material in a region including an inside of the first through hole, in such a manner that a second through hole is provided penetrating through the insulating material; and a third step of providing a conductive member within the second through hole that penetrates through at least the insulating material in the inside of the first through hole, wherein the first through hole extends through the semiconductor element.

2. The method of manufacturing a semiconductor device as defined by claim 1, further comprising steps of:

stacking a plurality of the semiconductor devices manufactured by the method defined by claim 1; and electrically connecting upper and lower semiconductor elements by the conductive member.

3. The method of manufacturing a semiconductor device as defined by claim 2, wherein in the second step, the insulating material is formed to cover a surface of the semiconductor element which is opposite to a surface on which the electrode is formed.

4. The method of manufacturing a semiconductor device as defined by claim 3, wherein the insulating material is formed of a resin, wherein a plurality of the semiconductor elements are pasted together by using the resin as an adhesive, and wherein the conductive member and the electrode are electrically connected by heating the resin to complete hardening contraction of the resin.

5. The method of manufacturing a semiconductor device as defined by claim 4, wherein the resin is heated before a plurality of the semiconductor elements are pasted together, to activate the adhesive force of the resin.

6. The method of manufacturing a semiconductor device as defined by claim 1, wherein the insulating material is formed of a resin, and wherein the resin is applied in the second step.

7. The method of manufacturing a semiconductor device as defined by claim 1, wherein in the second step, the first through hole is filled with the insulating material, and the second through hole having a diameter smaller than a diameter of the first through hole is formed inside the first through hole, in such a manner as to pass through the insulating material.

8. The method of manufacturing a semiconductor device as defined by claim 1, wherein the conductive member is a conductive paste, and wherein the second through hole is filled with the conductive paste in the second step.

9. The method of manufacturing a semiconductor device as defined by claim 1, wherein the second through hole is formed with a taper that decreases in dimension towards the electrode of the semiconductor element.

10. The method of manufacturing a semiconductor device as defined by claim 1, wherein the second through hole is formed with a taper that decreases in dimension away from the electrode of the semiconductor element.

11. The method of manufacturing a semiconductor device as defined by claim 1, wherein at least one of the first through hole and the second through hole is formed by a laser beam.

12. The method of manufacturing a semiconductor device as defined by claim 11, wherein the laser beam is irradiated from a surface opposite to a surface of the semiconductor element on which the electrode is formed.

13. A method of manufacturing a semiconductor device, the method comprising:

a first step of forming a first through hole that penetrates the location of the electrode in first and second semiconductor elements each having an electrode;

a second step of providing an insulating material in a region including an inside of the first through hole, in such a manner that a second through hole is provided penetrating through the insulating material; and a third step of electrically connecting the electrode of the semiconductor element and a conductive member, and fitting the conductive member into the second through hole in the second semiconductor device, and superposing the first and second semiconductor elements, wherein the first through hole extends through the respective first and second semiconductor elements.

14. The method of manufacturing a semiconductor device as defined by claim 13, wherein in the second step, the insulating material is formed to cover a surface of the semiconductor element which is opposite to a surface on which the electrode is formed.

15. The method of manufacturing a semiconductor device as defined by claim 14, wherein the insulating material is formed of a resin, wherein a plurality of the semiconductor elements are pasted together by using the resin as an adhesive, and wherein the conductive member and the electrode are electrically connecting by heating the resin to complete hardening contraction of the resin.

16. The method of manufacturing a semiconductor device as defined by claim 15, wherein the resin is heated before a plurality of the semiconductor elements are pasted together, to activate the adhesive force of the resin.

17. The method of manufacturing a semiconductor device as defined by claim 13, wherein the insulating material is formed of a resin, and wherein the resin is applied in the second step.

18. The method of manufacturing a semiconductor device as defined by claim 13, wherein in the second step, the first through hole is filled with the insulating material, and the second through hole having a diameter smaller than a diameter of the first through hole is formed inside the first through hole, in such a manner as to pass through the insulating material.

19. The method of manufacturing a semiconductor device as defined by claim 13, wherein the conductive member is a conductive paste, and wherein the second through hole is filled with the conductive paste in the second step.

20. The method of manufacturing a semiconductor device as defined by claim 13, wherein the conductive member is a bump, and wherein at least part of the bump engages with the second through hole in the semiconductor element during the third step.

21. The method of manufacturing a semiconductor device as defined by claim 20, wherein a plurality of the bumps are provided in a stack.

22. The method of manufacturing a semiconductor device as defined by claim 20, wherein after the third step, the bump is melted to fill the second through hole.

23. The method of manufacturing a semiconductor device as defined by claim 13, wherein the second through hole is formed with a taper that decreases in dimension towards the electrode of the semiconductor element.

24. The method of manufacturing a semiconductor device as defined by claim 13, wherein the second through hole is formed with a taper that decreases in dimension away from the electrode of the semiconductor element.

25. The method of manufacturing a semiconductor device as defined by claim 13, wherein at least one of the first through hole or the second through hole is formed by a laser beam.

26. The method of manufacturing a semiconductor device as defined by claim 25, wherein the laser beam is irradiated from a surface opposite to a surface of the semiconductor element on which the electrode is formed.

27. A semiconductor device manufactured by the method of manufacturing a semiconductor device as defined by claim 1.

28. A semiconductor device manufactured by the method of manufacturing a semiconductor device as defined by claim 13.

29. A semiconductor device comprising:

a semiconductor element having an electrode, a through hole being formed at a location of the electrode;

insulating material provided in a region including an inside of the through hole; and a conductive member provided in such a manner as to pass along a central axis of the through hole, wherein the first through hole extends through the semiconductor element.

30. The semiconductor device as defined by claim 29, wherein the through hole is filled with the conductive member.

31. The semiconductor device as defined by claim 29, wherein the through hole is formed with a taper that decreases in dimension towards the electrode of the semiconductor element.

32. The semiconductor device as defined by claim 29, wherein the through hole is formed with a taper that decreases in dimension away from the electrode of the semiconductor element.

33. The semiconductor device as defined by claim 29, wherein the insulating material is provided so as to expose the conductive member and to cover a surface of the semiconductor element which is opposite to a surface on which the electrode is formed.

34. The semiconductor device as defined by claim 29, wherein a part of the conductive member protrudes to an outside of the through hole, at a surface of the semiconductor element which is opposite to a surface on which the electrode is formed.

35. The semiconductor device as defined by claim 29, wherein a stack of a plurality of the semiconductor devices are provided, and upper and lower semiconductor elements are connected electrically by the conductive member.

36. A circuit board on which is mounted the semiconductor device as defined by claim 29.

37. Electronic equipment having the semiconductor device as defined by claim 29.

* * * * *